(12) United States Patent
Gupta et al.

(10) Patent No.: US 11,979,167 B2
(45) Date of Patent: May 7, 2024

(54) LOW POWER AND HIGH SPEED DATA WEIGHTED AVERAGING (DWA) TO BINARY CONVERTER CIRCUIT

(71) Applicant: STMicroelectronics International N.V., Geneva (CH)

(72) Inventors: Sharad Gupta, New Delhi (IN); Ankur Bal, Greater Noida (IN)

(73) Assignee: STMicroelectronics International N.V., Geneva (CH)

( * ) Notice: Subject to any disclaimer, the term of this patent is extended or adjusted under 35 U.S.C. 154(b) by 111 days.

(21) Appl. No.: 17/876,263

(22) Filed: Jul. 28, 2022

(65) Prior Publication Data
US 2023/0061509 A1 Mar. 2, 2023

Related U.S. Application Data

(60) Provisional application No. 63/233,686, filed on Aug. 16, 2021.

(51) Int. Cl.
  *H03M 1/06* (2006.01)
(52) U.S. Cl.
  CPC .................. *H03M 1/0665* (2013.01)
(58) Field of Classification Search
  CPC ...... H03M 7/165; H03M 1/06; H03M 1/0665; H03M 3/424; H03M 3/458
  See application file for complete search history.

(56) References Cited

U.S. PATENT DOCUMENTS

| | | | |
|---|---|---|---|
| 7,486,210 B1 | 2/2009 | Hong et al. | |
| 7,561,088 B1 | 7/2009 | Ferguson | |
| 7,675,448 B1 | 3/2010 | Huang et al. | |
| 7,679,539 B2 | 3/2010 | Lee et al. | |
| 7,719,455 B2 | 5/2010 | Kim et al. | |
| 7,868,807 B2 | 1/2011 | Liu et al. | |
| 9,100,041 B1* | 8/2015 | Richardson | H03M 3/30 |
| 9,214,953 B1 | 12/2015 | Mengad | |
| 9,859,911 B1 | 1/2018 | Chen et al. | |
| 10,050,640 B1 | 8/2018 | Bal et al. | |
| 10,693,489 B2 | 6/2020 | Roh et al. | |
| 10,763,884 B2 | 9/2020 | Hsiao et al. | |
| 2019/0229748 A1* | 7/2019 | Roh | H03M 1/066 |
| 2021/0110852 A1 | 4/2021 | Bal et al. | |

(Continued)

FOREIGN PATENT DOCUMENTS

CN 102638264 A 8/2012

OTHER PUBLICATIONS

Mayur, S. Marinaik: "Design of Novel Multiplexer Based Thermometer to Binary Code Encoder for 4 Bit Flash ADC," 2017 2nd IEEE International Conference on Recent Trends in Electronics Information & Communication Technology (RTEICT), May 19-20, 2017, India, pp. 1006-01009.

(Continued)

*Primary Examiner* — Lam T Mai
(74) *Attorney, Agent, or Firm* — Crowe & Dunlevy LLC (57) ABSTRACT

A data weighted averaging (DWA) data word in a standard or normal form unary code format is first converted to a thermometer control word in an alternative or spatial form unary code format. The thermometer control word is then converted from the alternative or spatial form unary code format to output a corresponding binary word.

28 Claims, 7 Drawing Sheets

(56) References Cited

U.S. PATENT DOCUMENTS

2022/0029636 A1\* 1/2022 Tripathi ................. H03M 3/37
2022/0069837 A1\* 3/2022 Bal ....................... H03M 3/464

OTHER PUBLICATIONS

Jubay, MC, et al: "Full-Custom Design of Split-Set Data Weighted Averaging With Output Register for Jitter Suppression," 1st International Conference in Applied Physics and Materials Science, IOP Conf. Series: Materials Science and Engineering 79 (2015) 012017, doi: 10.1088/1757-899X/769/1/012017 (9 pages).

\* cited by examiner

LOW POWER AND HIGH SPEED DATA WEIGHTED AVERAGING (DWA) TO BINARY CONVERTER CIRCUIT

CROSS REFERENCE TO RELATED APPLICATIONS

This application claims priority from U.S. Provisional Application for Patent No. 63/233,686, filed Aug. 16, 2021, the disclosure of which is incorporated herein by reference.

TECHNICAL FIELD

This disclosure is related to the field of data conversion processing and, in particular, to the conversion of a data weighted averaging (DWA) digital word into a binary digital word in support of low power and high speed data processing operations.

BACKGROUND

Figure 1:
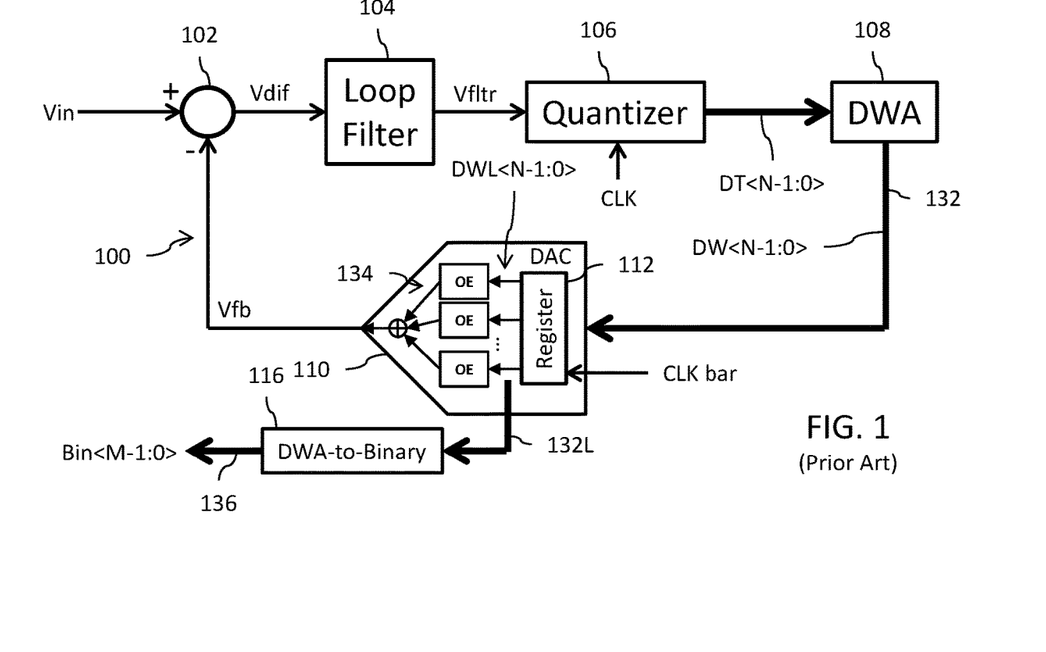
FIG. 1 is a block diagram of a prior art continuous time sigma-delta modulator converter circuit utilizing a data weighted averaging (DWA) circuit with a DWA-to-Binary conversion output.

FIG. 1 shows a block diagram of a continuous time sigma-delta modulator circuit 100. An analog input voltage Vin is received at a first input of a summation circuit 102. A second input of the summation circuit 102 receives an analog feedback voltage Vfb. The summation circuit 102 functions to determine a difference between the analog input voltage Vin and the analog feedback voltage Vfb and generate an analog difference voltage Vdif (i.e., Vdif=Vin−Vfb). A loop filter 104 implementing, for example, an integration function receives the analog difference voltage Vdif and outputs an analog filtered voltage Vfltr. A multi-bit quantization circuit 106 quantizes the analog filtered voltage Vfltr to generate a multi-bit thermometer data word DT on the leading edge of the clock signal CLK (i.e., the multi-bit quantization circuit 106 is clocked by the clock signal). The multi-bit thermometer data word DT is applied to a data weighted averaging (DWA) circuit 108. The DWA circuit 108 outputs an N-bit DWA data word DW<N−1:0> 132 that may be processed in a manner well known to those skilled in the art (for example, decimated and digitally filtered) to generate a digital signal corresponding to a conversion of the analog input voltage Vin to digital. In a feedback loop, the data word DW 132 is input to a digital-to-analog converter (DAC) circuit 110 that converts the data word DW 132 to generate the analog feedback voltage Vfb. The digital-to-analog converter circuit 110 includes an input register 112 that latches the data word DW 132 on the trailing edge of the clock signal CLK (i.e., the input register 112 is clocked by the logical inverse (CLK bar) of the clock signal). A plurality of unary output elements (OE) 134 are selectively actuated by the bits of the latched data word DW and the signals (for example, currents) generated by the output elements are summed to produce the analog feedback voltage Vfb.

To address any mismatch that exists with respect to the unary output elements 134 of the digital to analog converter, the implementation of the data weighted averaging algorithm by the DWA circuit 108 causes actuation to be spread relatively equally over time over all of the unary output elements 134. The noise due to output element mismatch is thus shaped by the DWA circuit which advantageously averages out the mismatch error in the band of interest. The mismatch across the unary output elements 124 is high-passed and pushed out beyond the band of interest. This is akin to first order noise shaping.

The data word DW 132 output of the modulator circuit 100, which as noted above is a DWA digital signal, may be processed for conversion to generate a binary signal. This is accomplished using a DWA-to-Binary converter circuit 116 coupled to the output of the register 112 and configured to convert the N-bit latched data word DWL 132L from DWA format to an M-bit data word 136 in binary format (Bin<M−1:0>). This DWA-to-Binary converter circuit 116 is known in the art as a "ones counter" since the binary value corresponding to the data word DW, DWL is simply equal to the Binary value equal to the number of bits of the N-bit data word DW, DWL which are set at logic 1. Consider, for example, the latched DWA data word DWL 132 having a value of <1,1,0,0,1,1,1>. There are five bits set at logic 1 and the M-bit data word (Bin<M−1:0>) 136 that is generated by the ones counting functionality of the DWA-to-Binary converter circuit 116 will have a value of 5 having a binary form of <1,0,1>.

Figure 2A:
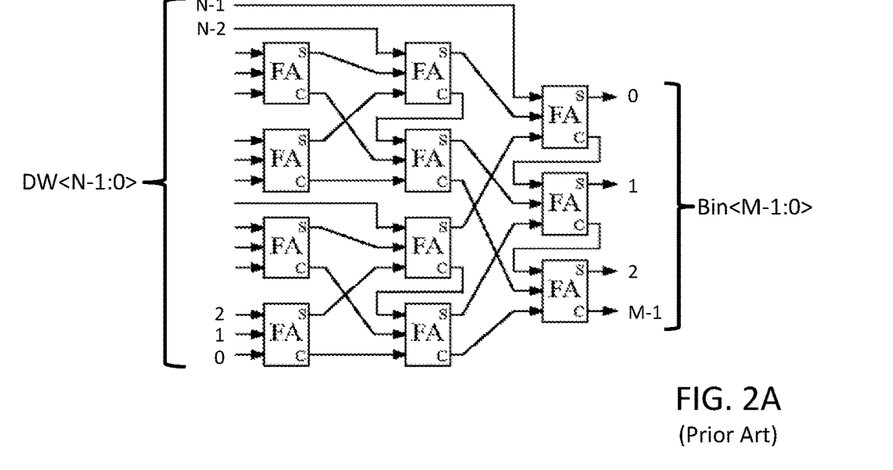
FIGS. 2A-2B are block diagrams of prior art DWA-to-Binary converter circuits.

FIG. 2A shows a diagram of a Wallace tree decoder used in the prior art for DWA-to-binary conversion. This tree decoder circuit is formed by a plurality of full adder (FA) circuits that are interconnected with each other in multiple stages. Each full adder has a three-bit input and a two-bit output, where the two bits of the output are a sum (S) bit and a carry (C) bit for the addition operation performed on the logic states of the signals received by the three-bit input. Outputs of adders in one given stage are applied as inputs to adders in a subsequent stage (and sometimes also to adders in the same stage). The converter circuit receives the N-bit data word DW<N−1:0> with the bits applied to the adders in all stages, and the outputs of the adders in the last stage provide the bits of the M-bit data word (Bin<M−1:0>).

Figure 2B:
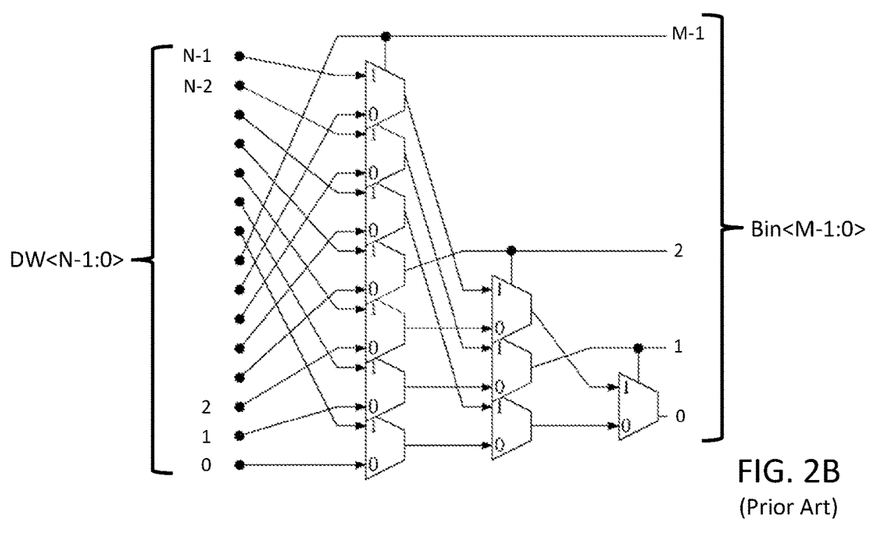

FIG. 2B shows a diagram of a multiplexed converter circuit used in the prior art for DWA-to-binary conversion. This converter circuit is formed by a plurality of multiplexer (MUX) circuits that are interconnected with each other in multiple stages. Bits of the N-bit data word DW<N−1:0> are input to the MUXes of the first stage, with one bit serving as a first stage MUX select signal. Bits output from the first stage are input to the MUXes of the second stage, with one bit serving as a second stage MUX select signal. Lastly, bits output from the second stage are input to the MUXes of the third stage, with one bit serving as a third stage MUX select signal. The bits output from MUXes of the third stage provide the M-bit data word (Bin<M−1:0>).

There are concerns with the use of the DWA-to-binary converter circuits as shown in FIGS. 2A-2B. In a preferred implementation, the data words DW, each of which being a DWA digital signal, are generated (for example by a continuous time sigma-delta modulator circuit like that shown in FIG. 1) at a very high speed (for example, for speeds at or in excess of 2 GHz). The DWA-to-binary conversion operation is then a timing and power intensive process that is not well suited to be performed by the circuits of FIGS. 2A-2B due to their use, for example, of summation and/or logic pipelining architectures.

A need therefor exists for a low power, high speed DWA-to-Binary converter circuit.

SUMMARY

This summary is provided to introduce a selection of concepts that are further described below in the detailed description. This summary is not intended to identify key or essential features of the claimed subject matter, nor is it intended to be used as an aid in limiting the scope of the claimed subject matter.

In an embodiment, a circuit converts a data weighted averaging (DWA) data word in a standard or normal form unary code format into a binary word. The circuit comprises: a first converter circuit configured to convert the DWA data word from the standard or normal form unary code format to a thermometer control word in an alternative or spatial form unary code format; and a second converter circuit configured to convert the thermometer control word from the alternative or spatial form unary code format to the binary word.

In an embodiment, a method comprises: first converting a data weighted averaging (DWA) data word from a standard or normal form unary code format to a thermometer control word in an alternative or spatial form unary code format; and second converting the thermometer control word from the alternative or spatial form unary code format to the binary word.

In an embodiment, a circuit converts a data weighted averaging (DWA) data word in a standard or normal form unary code format into a binary word. The circuit comprises: a first detection circuit configured to identify a bit location in the DWA data word where a string of logic 1 bits begins and generate an input data word having a single logic 1 bit at the beginning bit location; a second detection circuit configured to identify a bit location in the DWA data word where the string of logic 1 bits ends and generate a select data word having a single logic 1 bit at the ending bit location; a circular shift circuit having a data input configured to receive the input data word and a select input configured to receive the select data word, said circular shift circuit configured to output a thermometer control word in an alternative or spatial form unary code format having a single logic 1 bit at a shifted bit location equal to the beginning bit location circularly shifted by the ending bit location; and a conversion circuit configured to convert the thermometer control word from the alternative or spatial form unary code format to the binary word.

In an embodiment, a method comprises: first detecting a bit location in the DWA data word where a string of logic 1 bits begins and generating an input data word having a single logic 1 bit at the beginning bit location; second detecting a bit location in the DWA data word where the string of logic 1 bits ends and generating a select data word having a single logic 1 bit at the ending bit location; circularly shifting bits of the input data word in response to the select data word to generate a thermometer control word in an alternative or spatial form unary code format having a single logic 1 bit at a shifted bit location equal to the beginning bit location circularly shifted by the ending bit location; and converting the thermometer control word from the alternative or spatial form unary code format to a binary word.

DETAILED DESCRIPTION

In the following detailed description and the attached drawings, specific details are set forth to provide a thorough understanding of the present disclosure. However, those skilled in the art will appreciate that the present disclosure may be practiced, in some instances, without such specific details. In other instances, well-known elements have been illustrated in schematic or block diagram form in order not to obscure the present disclosure in unnecessary detail. Additionally, for the most part, specific details, and the like, have been omitted inasmuch as such details are not considered necessary to obtain a complete understanding of the present disclosure, and are considered to be within the understanding of persons of ordinary skill in the relevant art.

Figure 3:
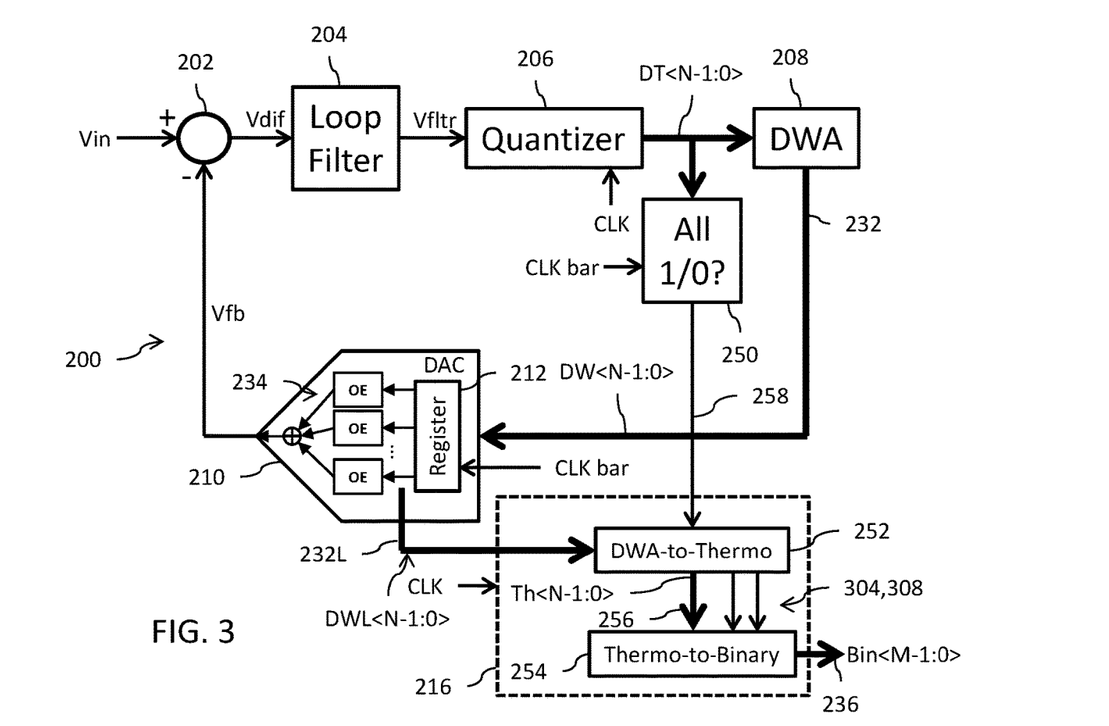
FIG. 3 is a block diagram of a continuous time sigma-delta modulator converter circuit utilizing a DWA circuit with a low power, high speed DWA-to-Binary conversion output.

Reference is now made to FIG. 3 which shows a block diagram of a continuous time sigma-delta modulator converter circuit 200 utilizing a data weighted averaging (DWA) circuit with a low power, high speed DWA-to-Binary conversion output. An analog input voltage Vin is received at a first input of a summation circuit 202. A second input of the summation circuit 202 receives an analog feedback voltage Vfb. The summation circuit 202 functions to determine a difference between the analog input voltage Vin and the analog feedback voltage Vfb and generate an analog difference voltage Vdif (i.e., Vdif=Vin−Vfb). A loop filter 204 implementing, for example, an integration function receives the analog difference voltage Vdif and outputs an analog filtered voltage Vfltr. A multi-bit quantization circuit 206 quantizes the analog filtered voltage Vfltr to generate a multi-bit thermometer data word DT on the leading edge of the clock signal CLK (i.e., the multi-bit quantization circuit 106 is clocked by the clock signal).

The multi-bit thermometer data word DT has a standard or normal form unary code format that represents the natural number n using n logic 1 bits followed (or preceded) by as many logic 0 bits as are needed to fill out the remaining bits in the N-bit data word. So, for example, with an N-bit DWA data word wherein N=8, if the natural number is 3, the multi-bit thermometer data word DT would include three logic 1 bits followed (or preceded) by five logic 0 bits as illustrated, for example, by <1,1,1,0,0,0,0,0> or <0,0,0,0,0,1,1,1>. The Table below illustrates the standard or normal form unary code format for natural numbers 0 to 7 with an N=7 bit data word.

| 0 | <0, 0, 0, 0, 0, 0, 0> |
| 1 | <0, 0, 0, 0, 0, 0, 1> |
| 2 | <0, 0, 0, 0, 0, 1, 1> |
| 3 | <0, 0, 0, 0, 1, 1, 1> |
| 4 | <0, 0, 0, 1, 1, 1, 1> |
| 5 | <0, 0, 1, 1, 1, 1, 1> |
| 6 | <0, 1, 1, 1, 1, 1, 1> |
| 7 | <1, 1, 1, 1, 1, 1, 1> |

The multi-bit thermometer data word DT is applied to a data weighted averaging (DWA) circuit 208. The DWA circuit 208 applies a data weighted averaging algorithm to the received multi-bit thermometer data word DT and outputs an N-bit DWA data word DW<N−1:0> 232. The Table below illustrates an example of a series of eight consecutive multi-bit thermometer data words generated by the quantizer 206 and the corresponding series of eight consecutive DWA data words generated by the DWA circuit 208 as a result of implementation of the data weighted averaging algorithm (where the left-most column provides the corresponding natural number of the thermometer data word DT).

| | | |
|---|---|---|
| 3 | <0, 0, 0, 0, 1, 1, 1> | <0, 0, 0, 0, 1, 1, 1> |
| 1 | <0, 0, 0, 0, 0, 0, 1> | <0, 0, 0, 1, 0, 0, 0> |
| 5 | <0, 0, 1, 1, 1, 1, 1> | <1, 1, 1, 0, 0, 1, 1> |
| 2 | <0, 0, 0, 0, 0, 1, 1> | <0, 0, 0, 1, 1, 0, 0> |
| 2 | <0, 0, 0, 0, 0, 1, 1> | <0, 1, 1, 0, 0, 0, 0> |
| 7 | <1, 1, 1, 1, 1, 1, 1> | <1, 1, 1, 1, 1, 1, 1> |
| 4 | <0, 0, 0, 1, 1, 1, 1> | <1, 0, 0, 0, 1, 1, 1> |
| 3 | <0, 0, 0, 0, 1, 1, 1> | <0, 1, 1, 1, 0, 0, 0> |

The N-bit DWA data word DW<N−1:0> 232 may be processed in a manner well known to those skilled in the art (for example, decimated and digitally filtered) to generate a digital signal corresponding to a conversion of the analog input voltage Vin to digital.

In a feedback loop, the data word DW 232 is input to a digital-to-analog converter (DAC) circuit 210 which converts the data word DW 232 to generate the analog feedback voltage Vfb. The digital-to-analog converter circuit 210 includes an input register 212 that latches the data word DW 232 on the trailing edge of the clock signal CLK (i.e., the input register 212 is clocked by the logical inverse (CLK bar) of the clock signal). A plurality of unary output elements (OE) 234 are actuated by the bits of the latched data word DW and the signals (for example, currents) generated by the output elements are summed to produce the analog feedback voltage Vfb.

The advantage provided by the operation of the DWA circuit 208 is that when considered over time a logic 1 state is relatively equally asserted for all bit locations in the DWA data word DW<N−1:0>. Conversely, for the thermometer data word DT it will be noted that a logic 1 state is much more frequently asserted for the less significant bit locations (i.e., those bits on the right of the foregoing table) than the more significant bit locations (i.e., those bits on the left of the foregoing table). When the bits of the DWA data word DW<N−1:0> are then used to actuate the unary output elements 234 of the DAC 210, the unary output elements 234 as a whole will be relatively equally actuated.

The data word DW 232 output by the modulator circuit 200, which as noted above is a DWA digital signal, may be processed for conversion to generate a binary signal. This is accomplished using a DWA-to-Binary converter circuit 216 coupled to the output of the register 212 and configured to convert the N-bit latched data word DWL 232L from DWA format to an M-bit data word 236 in binary format (Bin<M−1:0>). This DWA-to-Binary converter circuit 216 is specifically configured to support a low power, high speed conversion by first performing a DWA to thermometer code conversion using a first converter circuit 252 to generate an N-bit thermometer control word Th<N−1:0> 256 plus special case control signals 304 and 308 for detected all logic 1 bits and all logic 0 bits conditions, and then second performing a thermometer code to Binary conversion using a second converter circuit 254 which converts the thermometer control word Th<N−1:0> 256 to the Binary output word Bin<M−1:0> or selects the maximum or minimum Binary values for the Binary output word Bin<M−1:0> dependent on the logic state of the special case control signals 304 and 308.

In this context, however, the thermometer code of the thermometer control word Th<N−1:0> 256 generated by the first converter circuit 252 from the latched N-bit DWA data word DW<N−1:0> 132L is presented in the alternative or spatial form unary code format. Here, the natural number n is represented using one logic 1 bit that is spatially located at a bit position within the bits in the N-bit thermometer control word Th<N−1:0> 256 corresponding to the natural number. So, for example, with a thermometer control word Th<N−1:0> 256 wherein N=8, if the natural number is 3, the spatial form unary code would include one logic 1 bit at the third bit location as illustrated by <0,0,1,0,0,0,0,0> (considering here scanning in the direction from most significant bit MSB to least significant bit LSB). The Table below illustrates the alternative or spatial form unary code format for the natural numbers 1 to 8 with an N=8 bit data word.

| | |
|---|---|
| 1 | <1, 0, 0, 0, 0, 0, 0, 0> |
| 2 | <0, 1, 0, 0, 0, 0, 0, 0> |
| 3 | <0, 0, 1, 0, 0, 0, 0, 0> |
| 4 | <0, 0, 0, 1, 0, 0, 0, 0> |
| 5 | <0, 0, 0, 0, 1, 0, 0, 0> |
| 6 | <0, 0, 0, 0, 0, 1, 0, 0> |
| 7 | <0, 0, 0, 0, 0, 0, 1, 0> |
| 8 | <0, 0, 0, 0, 0, 0, 0, 1> |

The second converter circuit 254 then performs a conversion of the thermometer control word Th<N−1:0> 256 output from the first converter circuit 252 in its spatial form unary code format to Binary. This is accomplished, for example, by simply correlating the relative bit position that is asserted logic high to the binary value which is equal to that bit position. A look up table (LUT) or multiplexer circuit could, for example, be used for performing this correlation (see, FIGS. 9A-9B). So, for example, if the thermometer control word Th<N−1:0> 256 is <0,0,0,0,0,1,0,0>, the second converter circuit 254 would correlate the logic high bit at the sixth bit location to be equal to a value of 6 with a Binary equivalent of <0,1,1,0>.

With respect to the special case control signals 304 and 308, the second converter circuit 254 responds to assertion of either of these signals to generate specific maximum and minimum Binary values for output. For example, the special case control signal 304 may indicate that that the maximum Binary value should be output (for example, <1,1,1,1>) and the special case control signal 308 may indicate that that the minimum Binary value should be output (for example, <0,0,0,0>)

The inputs to the DWA-to-Binary converter circuit 216 are the N-bit latched data word DWL 232L, a control signal 258 indicative of whether the corresponding multi-bit thermometer data word DT from which the N-bit DWA data word DW<N−1:0> 132 is generated includes all logic 1 or all logic 0 bits, and the clock signal CLK. The control signal 258 is generated by an all logic 1/0 detector circuit 250 that receives bits of the multi-bit thermometer data word DT and operates to detect the all logic 1/0 condition. The special case control signals 304 and 308 are selectively asserted only if the control signal 258 is asserted by the all logic 1/0 detector circuit 250. The clock signal CLK is used to control latching of the generated Binary value.

Figure 4:
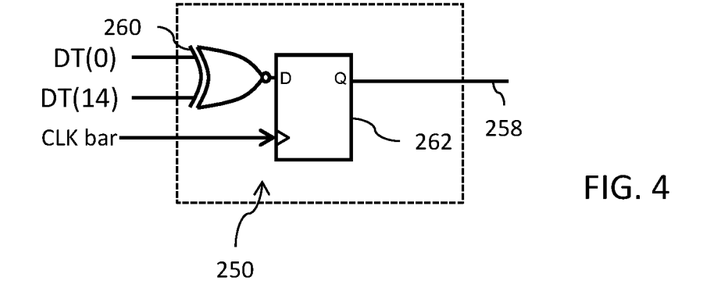
FIG. 4 is a circuit diagram for an all logic 1/0 detector circuit in the circuit of FIG. 3.

Reference is now made to FIG. 4 which shows a circuit diagram for the all logic 1/0 detector circuit 250. The circuit 250 includes an exclusive NOR logic gate 260 having a first input receiving the least significant bit (bit 0: DT(0)) of the multi-bit input data word DT<N–1:0> and a second input receiving the most significant bit (bit N–1: DT(N–1)) of the multi-bit input data word DT<N–1:0>. The signal that is output from the exclusive NOR logic gate 260 is applied to the data input of a D-type flip-flop 262 that is clocked by the inverse of the clock signal CLK (CLK bar). The D-type flip-flop 262 accordingly captures the logic state of the output signal from the exclusive NOR logic gate 260 with each pulse of the clock signal CLK and makes that logic state value available at the Q output of the flip-flop 262 as the control signal 258. The logic state of the control signal 258 is indicative of whether the multi-bit thermometer data word DT includes all logic 1 or all logic 0 bits.

The circuit 250 operates as follows: the exclusive NOR logic gate 260 determines when the least significant bit (bit 0:DT(0)) and the most significant bit (bit N–1:DT(N–1)) of the multi-bit input data word DT<N–1:0> are simultaneously either both logic 0 or both logic 1. For thermometer coded data in the standard or normal form unary code format, this occurs only when either all bits of data word DT<N–1:0> are logic 0 or all bits of data word DT<N–1:0> are logic 1. It is critical for the circuit 250 to catch this occurrence because when all bits of data word DT<N–1:0> are logic 0 or all bits of data word DT<N–1:0> are logic 1, then all bits of the correspondingly generated data word DW<N–1:0> will be also all logic 0 or all logic 1, respectively. This case, or condition, will affect the manner with which the DWA-to-Binary converter circuit 216 operates to produce the Binary output at maximum and minimum values from the latched N-bit DWA data word DW<N–1:0> 132L. This will be explained in more detail below. If all bits of the data word DT<N–1:0> are logic 0 or logic 1, the output of the exclusive NOR logic gate 260 is logic 1, and this logic high data state is captured by the D-type flip-flop 262 when the clock signal CLK pulses. Thus, when the condition of an all logic 1/0 is detected, the control signal 258 is asserted logic high.

Figure 5:
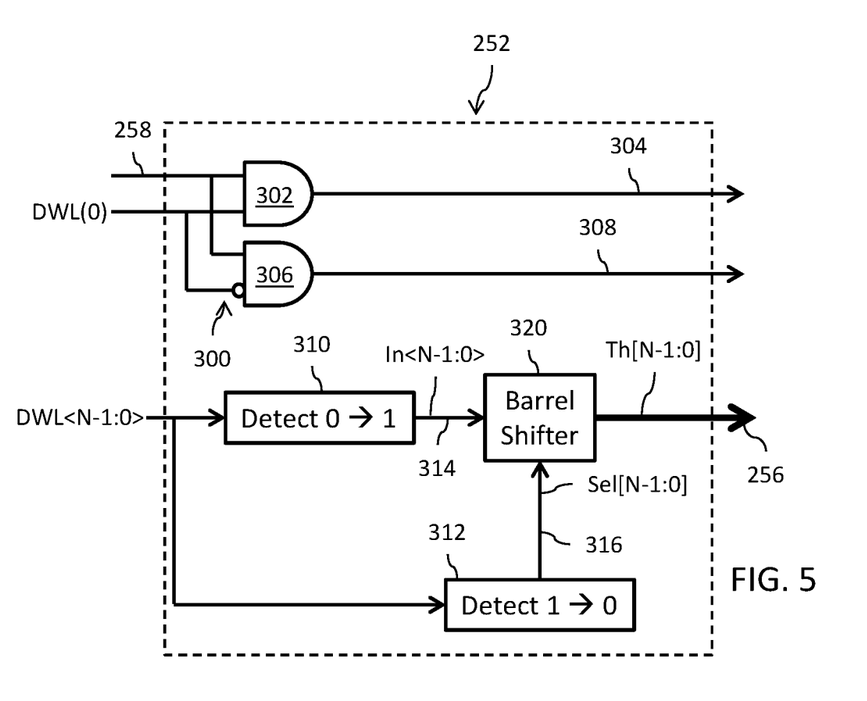
FIG. 5 is a block diagram of the first converter circuit for the DWA-to-Binary converter circuit in the circuit of FIG. 3.

FIG. 5 shows a block diagram of the first converter circuit 252 of the DWA-to-Binary converter circuit 216. A combinatorial logic circuit 300 receives the control signal 258 and a selected one of the bits, here the least significant bit (bit 0: DWL(0)) by example only, of the latched N-bit DWA data word DWL<N–1:0> 132L. The logic circuit 300 includes a first logical AND gate 302 having a first input that receives the control signal 258 and a second input that receives the least significant bit (bit 0: DWL(0)). The output of the first logical AND gate 302 is logic high when both inputs are logic high, which occurs only when all bits of the multi-bit thermometer data word DT are logic 1, and thus the gate 302 functions as an all logic 1 detector. The special case signal 304 output by the first logical AND gate 302 is asserted logic high to indicate detection of the all logic 1 condition. The logic circuit 300 further includes a second logical AND gate 306 having a first input that receives the control signal 258 and a second input that receives the logical inversion of the least significant bit (bit 0: DWL(0)). The output of the second logical AND gate 306 is logic high when both inputs are logic high, which occurs only when all bits of the multi-bit thermometer data word DT are logic 0, and thus the gate 306 functions as an all logic 0 detector. The special case signal 308 output by the second logical AND gate 302 is asserted logic high to indicate detection of the all logic 0 condition.

The first converter circuit 252 further includes a first detector circuit 310 for detecting the location in the latched N-bit DWA data word DWL<N–1:0> of a beginning of a string of consecutive logic 1 bits for the thermometer code. The first detector circuit 310 outputs an N-bit input data word In<N–1:0> 314 that includes a single asserted logic 1 bit at the detected beginning bit location. A second detector circuit 312 operates to detect the location in the latched N-bit DWA input data word DWL<N–1:0> of an ending of the string of consecutive logic 1 bits for the thermometer code. The second detector circuit 312 outputs an N-bit select control data word Sel<N–1:0> 316 that includes a single asserted logic 1 bit at the detected ending bit location.

The beginning bit location provided by the asserted bit in the input data word In<N–1:0> 314 (as identified by the first detector circuit 310) and the ending bit location provided by the asserted bit in the select control data word Sel<N–1:0> 316 (as identified by the second detector circuit 312) are applied as the data input and select input, respectively, to a circular shift circuit 320. The shift circuit 320 performs a unidirectional circular (barrel) shift of the identified beginning bit location by a number of bits as specified by the ending bit location and generates the N-bit thermometer code data word Th<N–1:0> 256 that includes a single asserted logic 1 bit at the shifted bit location.

Figure 6:
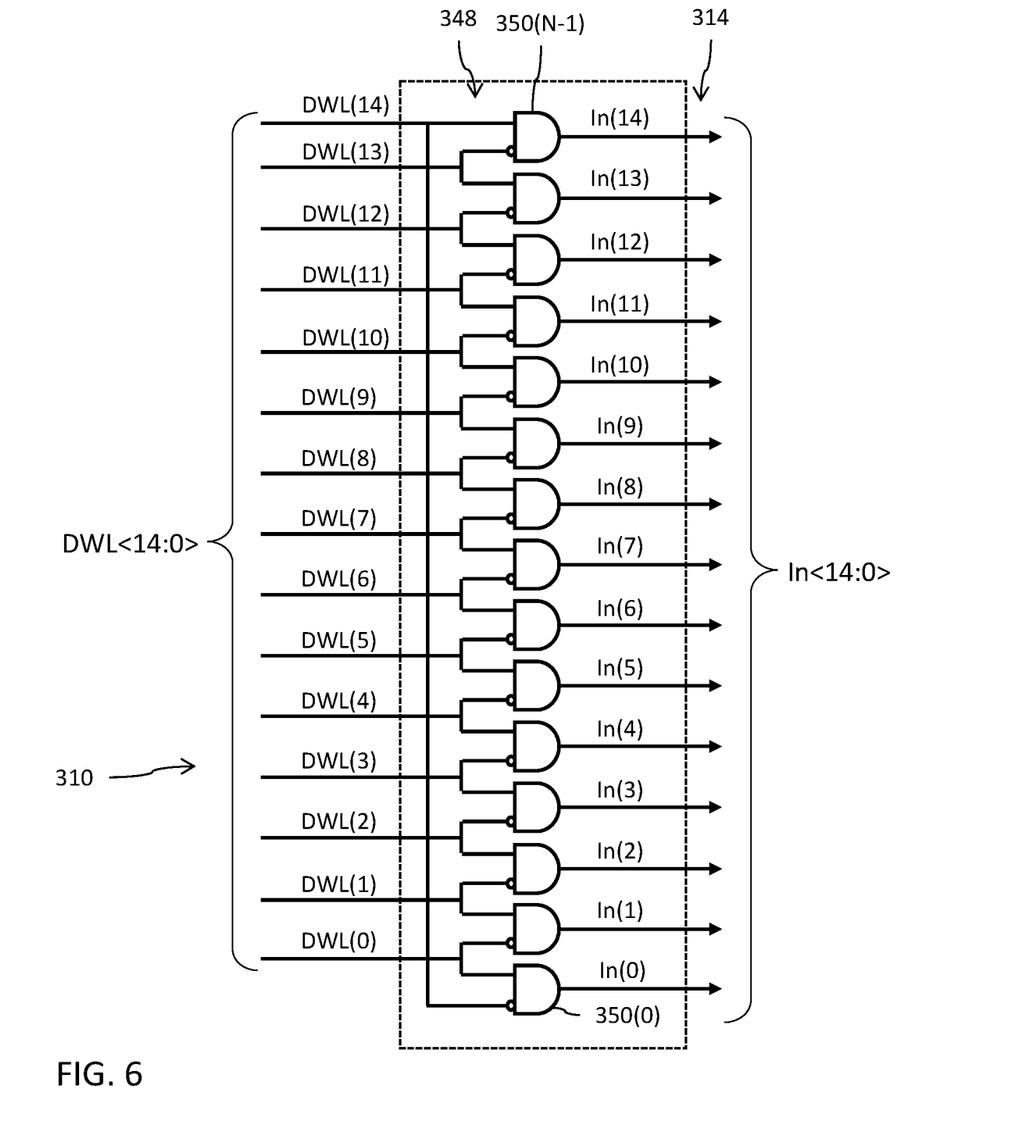
FIG. 6 is a circuit diagram for logic 0→logic 1 change detection circuit.

Reference is now made to FIG. 6 which shows a circuit diagram for the first detector circuit 310 that operates to detect the location in the latched N-bit DWA data word DWL<N–1:0> of a beginning of a string of consecutive logic 1 bits (i.e., the location of the logic 0→logic 1 change) for the thermometer code (scanning for the logic state transition in the direction from least significant bit LSB to most significant bit MSB). The first detector circuit 310 includes a combinatorial logic circuit 348 formed by N logical AND gates 350(0) to 350(N–1) operating to generate the N-bit input data word In<N–1:0> 314 that is applied to the input of the circular shift circuit 320. A first input of each AND gate 350 is connected to a corresponding bit of the latched multi-bit output data word DWL<N–1:0> output by the register 212. A second input of each AND gate 350 is connected to a logical inversion of an adjacent bit of the latched multi-bit output data word DWL<N–1:0>. For example, AND gate 350(0) has a first input connected to receive the corresponding bit DWL(0) and a second input connected to receive the logical inversion of adjacent bit DWL(N–1), in the example where N=15, this would be bit DWL(14). The output of AND gate 350(0) generates one bit (In(0)) of the input data word In<N–1:0> 314. Similarly, AND gate 350(N–1)—in the example where N=15, this would be AND gate 350(14)—has a first input connected to receive the corresponding bit DWL(N–1)—in the example where N=15, this would be bit DWL(14)—and a second input connected to receive the logic inversion of adjacent bit DWL(N–2)—in the example where N=15, this would be bit DWL(13). The output of AND gate 350(N–1) provides another bit (In(14)) of the input data word In<N–1:0> 314. The other AND gates 350 are similarly connected to logically inverted bits and adjacent bits of the latched multi-bit output data word DWL<N–1:0> and generate corresponding bits of the input data word In<N–1:0> 314.

The combinatorial logic circuit 348 operates to identify (from least significant bit LSB to most significant bit MSB) where the string of bits in the received latched multi-bit output data word DWL<N–1:0> transitions to logic 0 from logic 1 and thus identify the bit location where the string of consecutive logic 1 bits in the latched multi-bit output data word DWL<N–1:0> begins. The AND gate 350 whose first input receives that logic 1 value and whose second input receives the inversion of a logic 0 value from the next adjacent lower bit in the latched multi-bit output data word DWL<N−1:0> will output a logic 1 value. All other AND gates 350 will output a logic low value because at least one of their first or second inputs will receive a logic 0 input. The connection of the AND gate 350(0) to receive corresponding bit DWL(0) and the logical inversion of adjacent bit DWL(N−1) is important because this connection effectuates a wraparound of the bit location finding operation.

Figure 7:
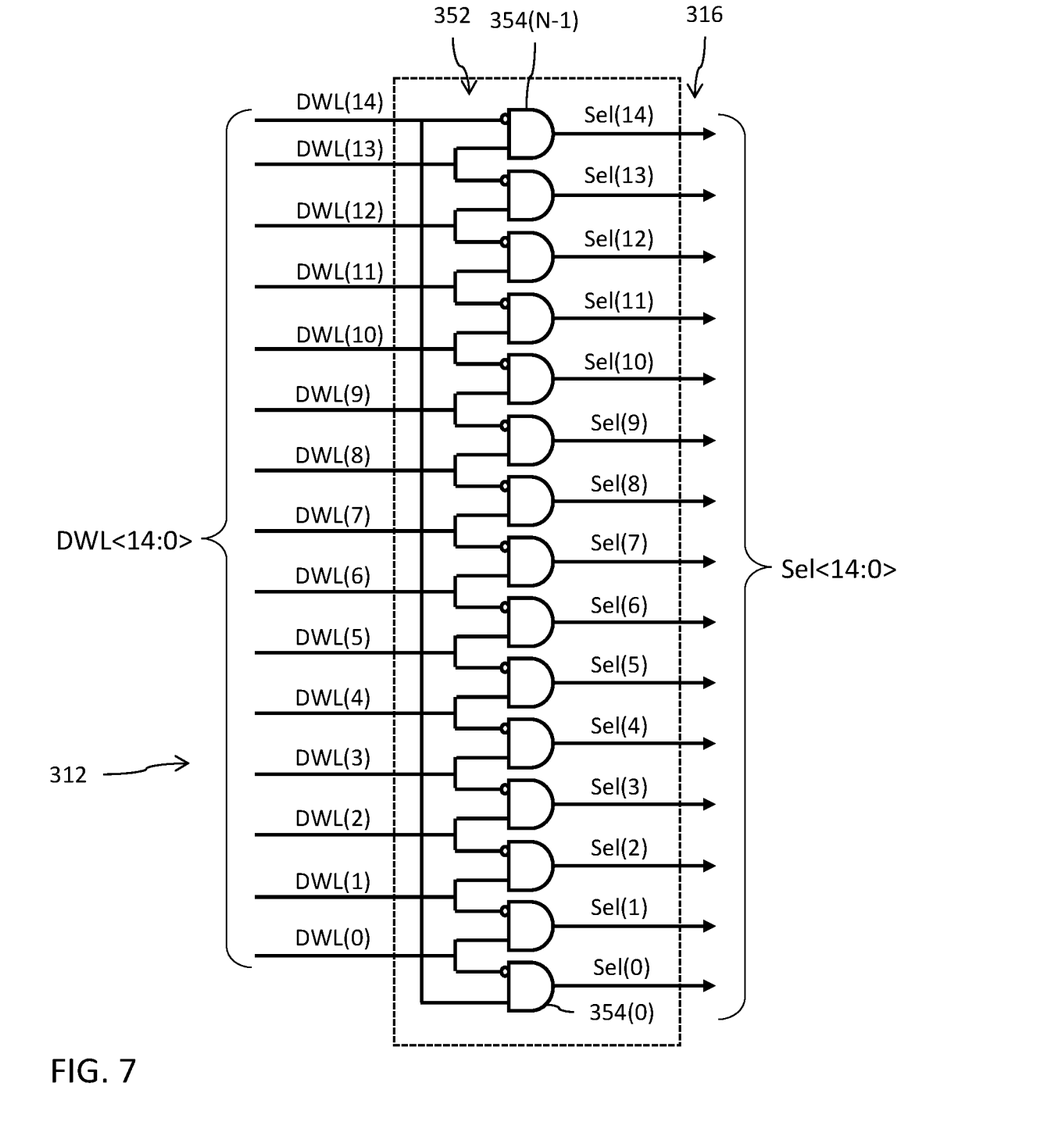
FIG. 7 is a circuit diagram for logic 1→logic 0 change detection circuit.

Reference is now made to FIG. 7 which shows a circuit diagram for the second detector circuit 312 that operates to detect the location in the latched N-bit DWA data word DWL<N−1:0> of an ending of a string of consecutive logic 1 bits (i.e., the location of the logic 1→logic 0 change) for the thermometer code (scanning for the logic state transition in the direction from least significant bit LSB to most significant bit MSB). The second detector circuit 312 includes a combinatorial logic circuit 352 formed by N logical AND gates 354(0) to 354(N−1) operating to generate the N-bit selection data word Sel<N−1:0> 316 that is applied to the select input of the circular shift circuit 320. A first input of each AND gate 354 is connected to a logical inversion of a corresponding bit of the latched multi-bit output data word DWL<N−1:0> output by the register 212. A second input of each AND gate 354 is connected to an adjacent bit of the latched multi-bit output data word DWL<N−1:0>. For example, AND gate 354(0) has a first input connected to receive the logical inversion of corresponding bit DWL(0) and a second input connected to receive adjacent bit DW(N−1), in the example where N=15, this would be bit DWL(14). The output of AND gate 354(0) generates one bit (Sel(0)) of the multi-bit selection signal Sel<N−1:0>. Similarly, AND gate 354(N−1)—in the example where N=15, this would be AND gate 354(14)—has a first input connected to receive the logical inversion of corresponding bit DWL(N−1)—in the example where N=15, this would be bit DWL(14)—and a second input connected to receive adjacent bit DWL(N−2)—in the example where N=15, this would be bit DWL(13). The output of AND gate 354(N−1) provides another bit (Sel(14)) of the multi-bit selection signal Sel<N−1:0>. The other AND gates 354 are similarly connected to logically inverted bits and adjacent bits of the latched multi-bit output data word DWL<N−1:0> and generate corresponding bits of the multi-bit selection signal Sel<N−1:0>.

The combinatorial logic circuit 352 operates to identify (from least significant bit LSB to most significant bit MSB) where the string of bits in the received latched multi-bit output data word DWL<N−1:0> transitions to logic 0 from logic 1 and thus identify the bit location where the string of consecutive logic 1 bits in the latched multi-bit output data word DWL<N−1:0> ends. The AND gate 354 whose first input receives the inversion of that logic 0 value and whose second input receives a logic 1 value from the next adjacent lower bit in the latched multi-bit output data word DWL<N−1:0> will output a logic 1 value. All other AND gates 354 will output a logic low value because at least one of their first or second inputs will receive a logic 0 input. The connection of the AND gate 354(0) to receive the logical inversion of corresponding bit DWL(0) and adjacent bit DWL(N−1) is important because this connection effectuates a wraparound of the bit location finding operation.

With reference once again to FIG. 5, the barrel shifter circuit 320 may be efficiently implemented using a crossbar switch matrix. The data input of the crossbar switch matrix receives the N-bit input data word In<N−1:0> 314 and the select input of the crossbar switch matrix receives the N-bit selection data word Sel<N−1:0> 316. The crossbar switch operates in response to the multi-bit selection signal Sel<N−1:0> to selectively map switch inputs to switch outputs in order to effectuate the circular barrel shifting specified by the N-bit selection data word Sel<N−1:0> 316.

Figure 8:
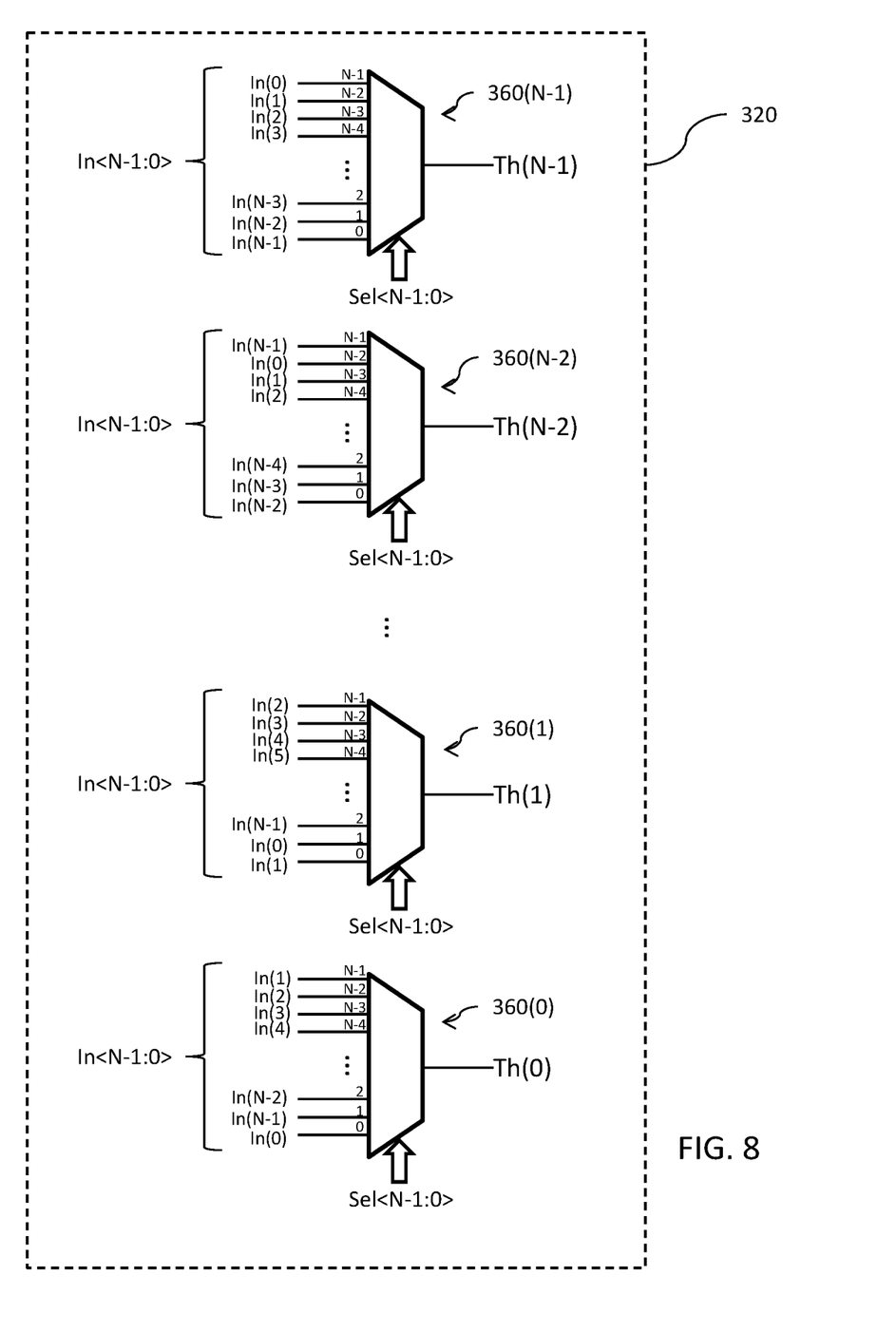
FIG. 8 is a block diagram of a circular shift circuit implemented by a crossbar switch.

The physical configuration of the crossbar switch matrix for the shifting circuit 320 is shown in FIG. 8. The operation of the crossbar switch matrix for shifting may be logically represented by N multiplexers 360(0) to 360(N−1), wherein each multiplexer 360 is an N:1 multiplexer. The bits of the received input data word In<N−1:0> are identified as In(N−1) . . . , In(0). The bits of the generated multi-bit output data word Out<N−1:0> are identified as Out(N−1), . . . , Out(0). The selection control input of each multiplexer 540 receives the multi-bit selection signal Sel<N−1:0>. It will be noted that the wrap around sequence order for the bits of the multi-bit input data word In<N−1:0> at the inputs of each multiplexer is different. As an example, for multiplexer 360(N−1), the order of the bits of the multi-bit input data word In<N−1:0> at the input is In(N−1), In(N−2), . . . , In(0). For multiplexer 360(N−2), the order of the bits of the multi-bit input data word In<N−1:0> at the input is In(N−2), In(N−3), . . . , In(0), In(N−1). For multiplexer 360(1), the order of the bits of the multi-bit input data word In<N−1:0> at the input is In(1), In(0), In(N−1), . . . , In(3), In(2). For multiplexer 360(0), the order of the bits of the multi-bit input data word In<N−1:0> at the input is In(0), In(N−1), In(N−2), . . . , In(2), In(1). Those skilled in the art will recognize that the connection of the sequence of bits of the multi-bit input data word In<N−1:0> is effectively barrel-shifted across the N multiplexers 360(0) to 360(N−1). The effect of this is that the crossbar switch matrix operates to selectively connect bits of the multi-bit input data word In<N−1:0> to bits of the multi-bit output data word Out<N−1:0> with a selectable barrel shift position selected by the value of the multi-bit selection signal Sel<N−1:0>.

Figure 9A:
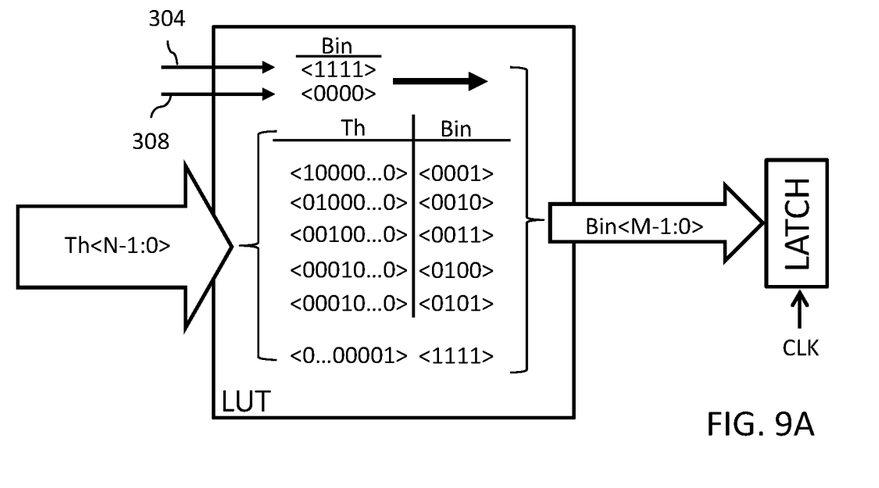
FIGS. 9A-9B are circuit diagrams for the second circuit for the DWA-to-Binary converter circuit in the circuit of FIG. 3.

As previously noted, the second converter circuit 254 operates to convert the thermometer control word Th<N−1:0> 256 from the spatial form unary code format to Binary. FIG. 9A shows one implementation of the second converter circuit 254 using a look-up table (LUT) circuit where the asserted bit in the thermometer control word Th<N−1:0> 256 selects the corresponding binary representation of the asserted bit location for output as the M-bit data word 236 in binary format (Bin<M−1:0>). If the special case signal 304 output by the first logical AND gate 302 is asserted logic high to indicate detection of the all logic 1 condition, the LUT circuit will select the maximum Binary value (for example, as illustrated a Binary value of <1111> corresponding to the number fifteen) for output as the M-bit data word 236. Conversely, if the special case signal 308 output by the second logical AND gate 306 is asserted logic high to indicate detection of the all logic 0 condition, the LUT circuit will select the minimum Binary value (for example, as illustrated a Binary value of <0000> corresponding to the number zero) for output as the M-bit data word 236. The selected binary value is then latched by a latching circuit in response to a pulse of the clock signal CLK.

Figure 9B:
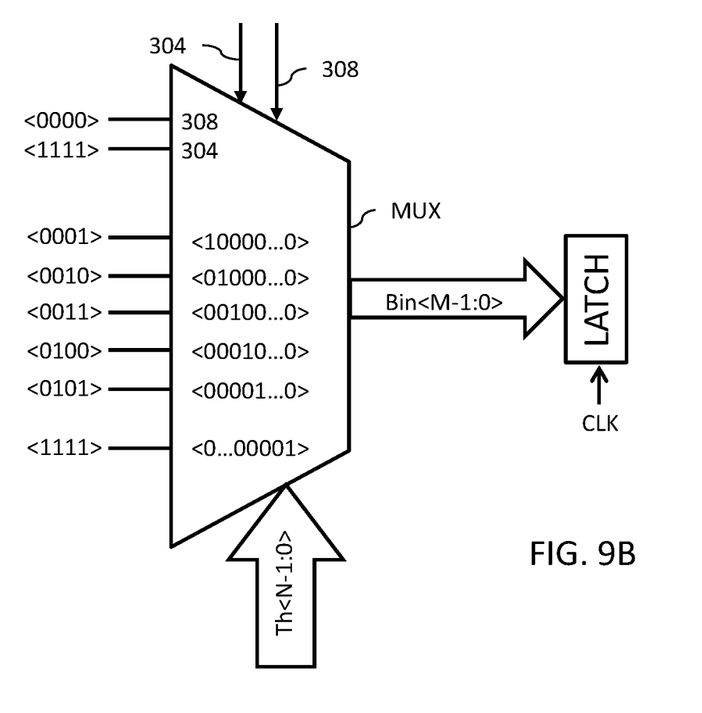

FIG. 9B shows another implementation of the second converter circuit 254 using a multiplexing circuit (MUX) where inputs of the MUX receive binary value representations of the bit locations (Bin 0 to Bin 15) and the thermometer control word Th<N−1:0> 256 is applied to the MUX select input. The MUX responds to the asserted bit location in the thermometer control word Th<N−1:0> 256 by selectively connecting one of the input binary values corresponding to that asserted bit location for output as the M-bit data word 236 in binary format (Bin<M−1:0>). The MUX further receives the special case signals 304 and 308.

In response to the assertion of the special case signal 304 by the first logical AND gate 302 which indicates detection of the all logic 1 condition, the MUX selectively connects the input maximum Binary value (for example, as illustrated a Binary value of <1111> corresponding to the number fifteen) for output as the M-bit data word 236. Conversely, in response to the assertion of the special case signal 308 by the second logical AND gate 306 which indicates detection of the all logic 0 condition, the MUX selectively connects the input minimum Binary value (for example, as illustrated a Binary value of <0000> corresponding to the number zero) for output as the M-bit data word 236. The selected binary value is then latched by a latching circuit in response to a pulse of the clock signal CLK.

Operation of the circuit for DWA-Binary conversion may be better understood by reference to some examples where N=15 and M=4.

In a first example, the latched multi-bit output data word DWL<N−1:0> 232L is:

| 1 | 1 | 1 | 0 | 0 | 0 | 0 | 0 | 1 | 1 | 1 | 1 | 1 | 1 | 1 |
|---|---|---|---|---|---|---|---|---|---|---|---|---|---|---|

The most significant bit DWL(14) is on the left and the least significant bit (DWL(0) is on the right. It will be noted that the latched multi-bit output data word DWL<N−1:0> 232L includes ten logic 1 bits, thus the result of the DWA-to-Binary conversion should output a binary value equal to ten.

The first detector circuit 310 finds the beginning bit location within the latched N-bit DWA data word DWL<N−1:0> where the string of consecutive logic 1 bits begins. This is the location of the transition in the sequence of bits in the data word from logic 0→logic 1. For the above example, this transition, and the beginning of the string of consecutive logic 1 bits, occurs at the thirteenth bit location. As a result, the first detector circuit 310 will generate the following multi-bit input data word In<N−1:0> 314:

| 0 | 0 | 1 | 0 | 0 | 0 | 0 | 0 | 0 | 0 | 0 | 0 | 0 | 0 | 0 |
|---|---|---|---|---|---|---|---|---|---|---|---|---|---|---|

It will be noted that only the thirteen bit is asserted logic 1.

The second detector circuit 312 finds the ending bit location within the latched N-bit DWA data word DWL<N−1:0> where the string of consecutive logic 1 bits ends. This is the location of the transition in the sequence of bits in the data word from logic 1→logic 0. For the above example, this transition, and the ending of the string of consecutive logic 1 bits, occurs at the seventh bit location. As a result, the second detector circuit 312 will generate the following multi-bit select data word Sel<N−1:0> 316:

| 0 | 0 | 0 | 0 | 0 | 0 | 0 | 1 | 0 | 0 | 0 | 0 | 0 | 0 | 0 |
|---|---|---|---|---|---|---|---|---|---|---|---|---|---|---|

It will be noted that only the seventh bit is asserted logic 1.

The circular shift circuit 320 then performs a circular shift operation on the multi-bit input data word In<N−1:0> 314 in response to the multi-bit select data word Sel<N−1:0> 316. This operation will shift the beginning bit location in the multi-bit input data word In<N−1:0> 314 by a number of bits equal to the ending bit location specified by multi-bit select data word Sel<N−1:0> 316. So, in this example, with the beginning bit location being at the thirteenth bit the shift circuit 320 will barrel shift (for example, here to the right—i.e., towards the least significant bit) by seven bit spots (as indicated by the seventh bit location for the ending bit location) to generate the multi-bit thermometer control word Th<N−1:0> 256:

| 0 | 0 | 0 | 0 | 0 | 0 | 0 | 0 | 0 | 1 | 0 | 0 | 0 | 0 | 0 |
|---|---|---|---|---|---|---|---|---|---|---|---|---|---|---|

Only the sixth bit location is asserted logic 1 (due to 13−7=6).

Because the multi-bit thermometer data word DT<N−1:0> from which the latched multi-bit output data word DWL<N−1:0> 232L is derived using DWA processing is not all logic 1 bits or all logic 0 bits, neither of the signals 304 or 304 are asserted and operation of the second converter circuit 254 is driven solely by the thermometer control word Th<N−1:0> 256.

The correlation of asserted logic 1 bit at the sixth bit position (from the LSB) in the thermometer control word Th<N−1:0> 256 (corresponding to the tenth bit position from the MSB), to a number and binary value is made by the second converter circuit 254 in accordance with the following table relationship (implemented using, for example, a look up table or multiplexing circuit as shown in FIGS. 9A-9B):

| thermometer Th<N-1:0> | Number | Binary Bin<M-1:0> |
|---|---|---|
| <100000000000000> | 1 | <0001> |
| <010000000000000> | 2 | <0010> |
| <001000000000000> | 3 | <0011> |
| <000100000000000> | 4 | <0100> |
| <000010000000000> | 5 | <0101> |
| <000001000000000> | 6 | <0110> |
| <000000100000000> | 7 | <0111> |
| <000000010000000> | 8 | <1000> |
| <000000001000000> | 9 | <1001> |
| *<000000000100000>* | 10 | <1010> |
| <000000000010000> | 11 | <1011> |
| <000000000001000> | 12 | <1100> |
| <000000000000100> | 13 | <1101> |
| <000000000000010> | 14 | <1110> |
| <000000000000001> | 15 | <1111> |

The "*" in the above table designates the sixth entry from the bottom (LSB) which matches the thermometer control word Th<N−1:0> 256 for the example, which will result in the output of the Binary data word Bin<M−1:0> with a value of <1010> corresponding to the number ten.

In a second example, the latched multi-bit output data word DWL<N−1:0> 232L is:

| 0 | 0 | 0 | 0 | 0 | 0 | 0 | 0 | 1 | 1 | 1 | 1 | 0 | 0 |
|---|---|---|---|---|---|---|---|---|---|---|---|---|---|

The most significant bit DWL(14) is on the left and the least significant bit (DWL(0) is on the right. It will be noted that the latched multi-bit output data word DWL<N−1:0> 232L includes four logic 1 bits, thus the result of the DWA-to-Binary conversion should output a binary value equal to four.

The first detector circuit 310 finds the beginning bit location within the latched N-bit DWA data word DWL<N−1:0> where the string of consecutive logic 1 bits begins. This is the location of the transition in the sequence of bits in the data word from logic 0→logic 1. For the above example, this transition, and the beginning of the string of consecutive logic 1, occurs at the third bit location. As a result, the first detector circuit 310 will generate the following multi-bit input data word In<N−1:0> 314:

| 0 | 0 | 0 | 0 | 0 | 0 | 0 | 0 | 0 | 0 | 0 | 1 | 0 | 0 |
|---|---|---|---|---|---|---|---|---|---|---|---|---|---|

It will be noted that only the third bit is asserted logic 1.

The second detector circuit 312 finds the ending bit location within the latched N-bit DWA data word DWL<N−1:0> where the string of consecutive logic 1 bits ends. This is the location of the transition in the sequence of bits in the data word from logic 1→logic 0. For the above example, this transition, and the ending of the string of consecutive logic 1, occurs at the sixth bit location. As a result, the second detector circuit 312 will generate the following multi-bit select data word Sel<N−1:0> 316:

| 0 | 0 | 0 | 0 | 0 | 0 | 0 | 0 | 1 | 0 | 0 | 0 | 0 | 0 |
|---|---|---|---|---|---|---|---|---|---|---|---|---|---|

It will be noted that only the sixth bit is asserted logic 1.

The circular shift circuit 320 then performs a circular shift operation on the multi-bit input data word In<N−1:0> 314 in response to the multi-bit select data word Sel<N−1:0> 316. This operation will shift the beginning bit location in the multi-bit input data word In<N−1:0> 314 by a number of bits equal to the ending bit location specified by multi-bit select data word Sel<N−1:0> 316. So, in this example, with the beginning bit location being at the third bit the shift circuit 320 will barrel shift (for example, here to the right—i.e., towards the least significant bit) by six bit spots (as indicated by the sixth bit location for the ending bit location) to generate the multi-bit thermometer control word Th<N−1:0> 256:

| 0 | 0 | 0 | 1 | 0 | 0 | 0 | 0 | 0 | 0 | 0 | 0 | 0 | 0 |
|---|---|---|---|---|---|---|---|---|---|---|---|---|---|

Only the twelfth bit location is asserted logic 1 (due to 3−6=12 with wraparound and N=15).

Because the multi-bit thermometer data word DT<N−1:0> from which the latched multi-bit output data word DWL<N−1:0> 232L is derived using DWA processing is not all logic 1 bits or all logic 0 bits, neither of the signals 304 or 304 are asserted and operation of the second converter circuit 254 is driven solely by the thermometer control word Th<N−1:0> 256.

The correlation of asserted logic 1 bit at the twelfth bit position in the thermometer control word Th<N−1:0> 256 (corresponding to the fourth bit position from the MSB) to a number and binary value is made by the second converter circuit 254 in accordance with the following table relationship (implemented using, for example, a look up table or multiplexing circuit as shown in FIGS. 9A-9B):

| thermometer Th<N−1:0> | Number | Binary Bin<M−1:0> |
|---|---|---|
| <100000000000000> | 1 | <0001> |
| <010000000000000> | 2 | <0010> |
| <001000000000000> | 3 | <0011> |
| *<000100000000000>* | 4 | <0100> |
| <000010000000000> | 5 | <0101> |
| <000001000000000> | 6 | <0110> |
| <000000100000000> | 7 | <0111> |
| <000000010000000> | 8 | <1000> |
| <000000001000000> | 9 | <1001> |
| <000000000100000> | 10 | <1010> |
| <000000000010000> | 11 | <1011> |
| <000000000001000> | 12 | <1100> |
| <000000000000100> | 13 | <1101> |
| <000000000000010> | 14 | <1110> |
| <000000000000001> | 15 | <1111> |

The "*" in the above table designates the twelfth entry from the bottom LSB which matches the thermometer control word Th<N−1:0> 256 for the example, which will result in the output of the Binary data word Bin<M−1:0> with a value of <0100> corresponding to the number four.

In a third example, the latched multi-bit output data word DWL<N−1:0> 232L is:

| 1 | 1 | 1 | 1 | 1 | 1 | 1 | 1 | 1 | 1 | 1 | 1 | 1 | 1 | 1 |
|---|---|---|---|---|---|---|---|---|---|---|---|---|---|---|

The most significant bit DWL(14) is on the left and the least significant bit (DWL(0) is on the right. It will be noted that the latched multi-bit output data word DWL<N−1:0> 232L includes fifteen logic 1 bits, thus the result of the DWA-to-Binary conversion should output a binary value equal to fifteen.

The first detector circuit 310 tries to find the beginning bit location within the latched N-bit DWA data word DWL<N−1:0> where the string of consecutive logic 1 bits begins. This is the location of the transition in the sequence of bits in the data word from logic 0→logic 1. For the above example, such a transition does not exist because the data word includes all logic 1 bits and no bit of the input data word In<N−1:0> 314 is asserted logic 1.

The second detector circuit 312 tries to find the ending bit location within the latched N-bit DWA data word DWL<N−1:0> where the string of consecutive logic 1 bits ends. This is the location of the transition in the sequence of bits in the data word from logic 1→logic 0. For the above example, this transition does not exist because the data word includes all logic 1 bits and no bit of the select data word Sel<N−1:0> 316 is asserted logic 1.

With the multi-bit input data word In<N−1:0> 314 of:

| 0 | 0 | 0 | 0 | 0 | 0 | 0 | 0 | 0 | 0 | 0 | 0 | 0 | 0 |
|---|---|---|---|---|---|---|---|---|---|---|---|---|---| and with the multi-bit select data word Sel<N−1:0> 316 of:

| 0 | 0 | 0 | 0 | 0 | 0 | 0 | 0 | 0 | 0 | 0 | 0 | 0 | 0 |
|---|---|---|---|---|---|---|---|---|---|---|---|---|---| the multi-bit thermometer control word Th<N−1:0> 256 generated by the shifting circuit 320 is:

| 0 | 0 | 0 | 0 | 0 | 0 | 0 | 0 | 0 | 0 | 0 | 0 | 0 | 0 |
|---|---|---|---|---|---|---|---|---|---|---|---|---|---|

Because the multi-bit thermometer data word DT<N−1:0> from which the latched multi-bit output data word DWL<N−1:0> 232L is derived using DWA processing has all logic 1 bits, the control signal 258 is asserted logic 1 and the DWL(0) bit is also logic 1. The AND gate 302 will accordingly output a logic 1 state for the all logic 1 detect signal 304. In response to assertion of the all logic 1 detect signal 304, the second converter circuit 254 will generate the Binary data word Bin<M−1:0> with a maximum value of <1111> which corresponds to the number fifteen.

In a fourth example, the latched multi-bit output data word DWL<N−1:0> 232L is:

| 0 | 0 | 0 | 0 | 0 | 0 | 0 | 0 | 0 | 0 | 0 | 0 | 0 | 0 | 0 |
|---|---|---|---|---|---|---|---|---|---|---|---|---|---|---|

The most significant bit DWL(14) is on the left and the least significant bit DWL(0) is on the right. It will be noted that the latched multi-bit output data word DWL<N−1:0> 232L includes zero logic 1 bits, thus the result of the DWA-to-Binary conversion should output a binary value equal to zero.

The first detector circuit 310 tries to find the beginning bit location within the latched N-bit DWA data word DWL<N−1:0> where the string of consecutive logic 1 bits begins. This is the location of the transition in the sequence of bits in the data word from logic 0→logic 1. For the above example, such a transition does not exist because the data word includes all logic 0 bits and no bit of the input data word In<N−1:0> 314 is asserted logic 1.

The second detector circuit 312 tries to find the ending bit location within the latched N-bit DWA data word DWL<N−1:0> where the string of consecutive logic 1 bits ends. This is the location of the transition in the sequence of bits in the data word from logic 1→logic 0. For the above example, this transition does not exist because the data word includes all logic 0 bits and no bit of the select data word Sel<N−1:0> 316 is asserted logic 1.

With the multi-bit input data word In<N−1:0> 314 of:

| 0 | 0 | 0 | 0 | 0 | 0 | 0 | 0 | 0 | 0 | 0 | 0 | 0 | 0 | 0 |
|---|---|---|---|---|---|---|---|---|---|---|---|---|---|---| and with the multi-bit select data word Sel<N−1:0> 316 of:

| 0 | 0 | 0 | 0 | 0 | 0 | 0 | 0 | 0 | 0 | 0 | 0 | 0 | 0 | 0 |
|---|---|---|---|---|---|---|---|---|---|---|---|---|---|---| the multi-bit thermometer control word Th<N−1:0> 322 generated by the shifting circuit 320 is:

| 0 | 0 | 0 | 0 | 0 | 0 | 0 | 0 | 0 | 0 | 0 | 0 | 0 | 0 | 0 |
|---|---|---|---|---|---|---|---|---|---|---|---|---|---|---|

Because the multi-bit thermometer data word DT<N−1:0> from which the latched multi-bit output data word DWL<N−1:0> 232L is derived using DWA processing has all logic 0 bits, the control signal 258 is asserted logic 1 and the DWL(0) bit is logic 0. The AND gate 306 will accordingly output a logic 1 state for the all logic 0 detect signal 308. In response to assertion of the all logic 0 detect signal 308, the second converter circuit 254 will generate the Binary data word Bin<M−1:0> with a minimum value of <0000> which corresponds to the number zero.

The DWA-to-Binary converter circuit 216 is advantageously capable of running at high speed. Delay is minimal and there is no need for pipelining structures. Because clock and register switching is not required, the circuit 216 can operate with a significant reduction in power consumption as compared to prior art converter circuits. It will further be noted that the critical path through the circuit 216 is quite short due to the exploitation of the data processing flow with a DWA to thermometer conversion followed by a thermometer to Binary conversion that takes advantage of the spatial form unary code format for the thermometer control word Th<N−1:0>.

Although the preceding description has been described herein with reference to particular circuits and embodiments, it is not intended to be limited to the particulars disclosed herein; rather, it extends to all functionally equivalent structures, methods, and uses, such as are within the scope of the appended claims.

The invention claimed is:

1. A circuit for converting a data weighted averaging (DWA) data word in a standard or normal form unary code format into a binary word, comprising:
   a first converter circuit configured to convert the DWA data word from the standard or normal form unary code format to a thermometer control word in an alternative or spatial form unary code format; and
   a second converter circuit configured to convert the thermometer control word from the alternative or spatial form unary code format to the binary word.

2. The circuit of claim 1, wherein:
   the DWA data word in the standard or normal form unary code format has N bits and represents a natural number n by including n logic 1 bits followed or preceded by as many logic 0 bits as are needed to fill out remaining ones of the N bits; and
   the thermometer control word in the alternative or spatial form unary code format has N bits and represents the natural number n by including a single logic 1 bit positioned at a bit location in the N bits which corresponds to the natural number.

3. The circuit of claim 1, wherein the first converter circuit includes a logic circuit configured to detect whether the DWA data word is ail logic 1 bits and in response thereto assert an ail logic 1 control signal, and wherein the second converter circuit is configured to output a maximum binary value for the binary word in response to assertion of the all logic 1 control signal.

4. The circuit of claim 1, wherein the first converter circuit includes a logic circuit configured to detect whether the DWA data word is all logic 0 bits and in response thereto assert an all logic 0 control signal, and wherein the second converter circuit is configured to output a minimum binary value for the binary word in response to assertion of the all logic 0 control signal.

5. The circuit of claim 1, wherein the first converter circuit comprises:
   a first detection circuit configured to identify a bit location in the DWA data word where a string of logic 1 bits begins and generate an input data word having a single logic 1 bit at the beginning bit location;
   a second detection circuit configured to identify a bit location in the DWA data word where the string of logic 1 bits ends and generate a select data word having a single logic 1 bit at the ending bit location; and
   a circular shift circuit having a data input configured to receive the input data word and a select input configured to receive the select data word, said circular shift circuit configured to output the thermometer control word having a single logic 1 bit at a shifted bit location equal to the beginning bit location circularly shifted by the ending bit location.

6. The circuit of claim 5, wherein the circular shift circuit is a barrel shifting circuit.

7. The circuit of claim 5, wherein the circular shift circuit is implemented using a crossbar switch circuit with the select data word controlling mapping of bits from the input data word to bits of the thermometer control word.

8. The circuit of claim 1, wherein the second converter circuit comprises a lookup table circuit that maps the asserted bit of the thermometer control word to a binary value.

9. The circuit of claim 1, wherein the second converter circuit comprises a multiplexing circuit that selects a binary value in response to the asserted bit in the thermometer control word.

10. A method, comprising:
first converting a data weighted averaging (DWA) data word from a standard or normal form unary code format to a thermometer control word in an alternative or spatial form unary code format; and
second converting the thermometer control word from the alternative or spatial form unary code format to the binary word.

11. The method of claim 10, wherein:
the DWA data word in the standard or normal form unary code format has N bits and represents a natural number n by including n logic 1 bits followed or preceded by as many logic 0 bits as are needed to fill out remaining ones of the N bits; and
the thermometer control word in the alternative or spatial form unary code format has N bits and represents the natural number n by including a single logic 1 bit positioned at a bit location in the N bits which corresponds to the natural number.

12. The method of claim 10:
wherein first converting comprises detecting whether the DWA data word is all logic 1 bits and in response thereto assert an all logic 1 control signal; and
wherein second converting comprises outputting a maximum binary value for the binary word in response to assertion of the all logic 1 control signal.

13. The method of claim 10:
wherein first converting comprises detecting whether the DWA data word is all logic 0 bits and in response thereto assert an all logic 0 control signal; and
wherein second converting comprises outputting a minimum binary value for the binary word in response to assertion of the all logic 0 control signal.

14. The method of claim 10, wherein first converting comprises:
identifying a bit location in the DWA data word where a string of logic 1 bits begins;
generating an input data word having a single logic 1 bit at the beginning bit location;
identifying a bit location in the DWA data word where the string of logic 1 bits ends;
generating a select data word having a single logic 1 bit at the ending bit location; and
generating the circularly shifting thermometer control word having a single logic 1 bit at a shifted bit location equal to the beginning bit location circularly shifted by the ending bit location.

15. The method of claim 14, the circular shift is a barrel shift.

16. The method of claim 14, wherein the circular shift is implemented by crossbar switching to map bits from the input data word to bits of the thermometer control word.

17. The method of claim 10, wherein second converting comprises performing a lookup to map the asserted bit of the thermometer control word to a binary value.

18. The method of claim 10, wherein second converting comprises multiplexing to select a binary value in response to the asserted bit in the thermometer control word.

19. A circuit for converting a data weighted averaging (DWA) data word in a standard or normal form unary code format into a binary word, comprising:
a first detection circuit configured to identify a bit location in the DWA data word where a string of logic 1 bits begins and generate an input data word having a single logic 1 bit at the beginning bit location;
a second detection circuit configured to identify a bit location in the DWA data word where the string of logic 1 hits ends and generate a select data word having a single logic 1 bit at the ending bit location;
a circular shift circuit having a data input configured to receive the input data word a select input configured to receive the select data word, said circular shift circuit configured to output a thermometer control word in an alternative or spatial form unary code format having a single logic 1 bit at a shifted bit location equal to the beginning bit location circularly shifted by the ending bit location; and
a conversion circuit configured to convert the thermometer control word from the alternative or spatial form unary code format to the binary word.

20. The circuit of claim 19, wherein:
the DWA data word in the standard or normal form unary code format has N bits and represents a natural number n by including n logic 1 bits followed or preceded by as many logic 0 bits as are needed to fill out remaining ones of the N bits; and
the thermometer control word in the alternative or spatial form unary code format has N bits and represents the natural number n by including the single logic 1 bit positioned at a bit location in the N bits which corresponds to the natural number.

21. The circuit of claim 19, further comprising a logic circuit configured to detect whether the DWA data word is all logic 1 bits and in response thereto assert an all logic 1 control signal, and wherein the conversion circuit is configured to output a maximum binary value for the binary word in response to assertion of the all logic 1 control signal.

22. The circuit of claim 19, further comprising a logic circuit configured to detect whether the DWA data word is all logic 0 bits and in response thereto assert an all logic 0 control signal, and wherein the conversion circuit is configured to output a minimum binary value for the binary word in response to assertion of the all logic 0 control signal.

23. The circuit of claim 19, wherein the conversion circuit is configured to map the shifted bit location for the single logic 1 bit in the thermometer control word to a corresponding one of a plurality of binary words.

24. A method, comprising:
first detecting a bit location in the DWA data word where a string of logic 1 bits begins and generating an input data word having a single logic 1 bit at the beginning bit location;
second detecting a bit location in the DWA data word where the string of logic 1 bits ends and generating a select data word having a single logic 1 bit at the ending bit location;
circularly shifting bits of the input data word in response to the select data word to generate a thermometer control word in an alternative or spatial form unary code format having a single logic 1 bit at a shifted bit location equal to the beginning bit location circularly shifted by the ending hit location; and converting the thermometer control word from the alternative or spatial form unary code format to a binary word.

25. The method of claim 24, wherein:

the DWA data word in the standard or normal form unary code format has N bits and represents a natural number n by including n logic 1 bits followed or preceded by as many logic 0 bits as are needed to fill out remaining ones of the N bits; and the thermometer control word in the alternative or spatial form unary code format has N bits and represents the natural number n by including a single logic 1 bit positioned at a bit location in the N bits which corresponds to the natural number.

26. The method of claim 24, further comprising detecting whether the DWA data word is all logic 1 bits and in response thereto assert an all logic 1 control signal, and wherein converting comprises outputting a maximum binary value for the binary word in response to assertion of the all logic 1 control signal.

27. The method of claim 24, further comprising detecting whether the DWA data word is all logic 0 bits and in response thereto assert an all logic 0 control signal, and wherein converting comprises outputting a minimum binary value for the binary word in response to assertion of the all logic 0 control signal.

28. The circuit of claim 24, wherein converting comprises mapping the shifted bit location for the single logic 1 bit in the thermometer control word to a corresponding one of a plurality of binary words.

* * * * *